(12) United States Patent
Lee et al.

(10) Patent No.: US 6,661,083 B2
(45) Date of Patent: Dec. 9, 2003

(54) PLASTIC SEMICONDUCTOR PACKAGE

(75) Inventors: Sang D. Lee, Gilbert, AZ (US); Flynn Carson, Redwood City, CA (US); Ki T. Ryu, Kangdong-gu (KR); Koo H. Lee, Yeonsu-gu (KR)

(73) Assignee: ChipPAC, Inc, Fremont, CA (US)

( * ) Notice: Subject to any disclaimer, the term of this patent is extended or adjusted under 35 U.S.C. 154(b) by 3 days.

(21) Appl. No.: 10/081,490

(22) Filed: Feb. 22, 2002

(65) Prior Publication Data

US 2002/0163015 A1 Nov. 7, 2002

Related U.S. Application Data (60) Provisional application No. 60/272,239, filed on Feb. 27, 2001.

(51) Int. Cl.$^7$ .............................................. H01L 23/495
(52) U.S. Cl. ........................................ 257/676; 257/666
(58) Field of Search ................................. 257/666, 676

(56) References Cited

U.S. PATENT DOCUMENTS

| | | | |
|---|---|---|---|
| 5,278,446 A | * | 1/1994 | Nagaraj et al. |
| 5,594,234 A | | 1/1997 | Carter, Jr. et al. |
| 5,637,913 A | | 6/1997 | Kajihara et al. |
| 5,894,108 A | | 4/1999 | Mostafazadeh et al. |
| 6,143,981 A | | 11/2000 | Glenn |
| 6,229,200 B1 | | 5/2001 | Mclellan et al. |
| 6,316,838 B1 | * | 11/2001 | Ozawa et al. |
| 6,329,706 B1 | * | 12/2001 | Nam |
| 6,388,311 B1 | * | 5/2002 | Nakashima et al. |
| 6,498,392 B2 | * | 12/2002 | Azuma |

FOREIGN PATENT DOCUMENTS

| | | |
|---|---|---|
| JP | 402130864 A | 5/1990 |
| JP | 05036882 A | 2/1993 |
| JP | 06021317 A | 1/1994 |

* cited by examiner

*Primary Examiner*—Sheila V. Clark
(74) *Attorney, Agent, or Firm*—Haynes Beffel & Wolfeld LLP; Bill Kennedy (57) ABSTRACT

A lead frame for a surface mount semiconductor chip package includes a die attach paddle and leads, the die attach paddle having down bond attachment sites on an upper surface of the paddle near a peripheral margin of the paddle, and having a central die attach region on an upper surface of the paddle, wherein a portion of the upper surface of the paddle is recessed. In some embodiments the recessed portion of the upper surface of the paddle includes the die attach region, and in other embodiments the recessed portion of the upper surface of the paddle includes a groove. Also, a lead frame surface mount chip package including such a lead frame.

10 Claims, 9 Drawing Sheets

PLASTIC SEMICONDUCTOR PACKAGE

CROSS REFERENCE TO RELATED APPLICATION

This application claims priority from Provisional Application No. 60/272,239, filed Feb. 27, 2001.

BACKGROUND

This invention relates to semiconductor chip packaging.

Various surface mount package configurations are known. Each package type supports an integrated circuit chip or die, and provides protection from hostile environments and enables interconnections between the die and a printed circuit board.

Figure 1:
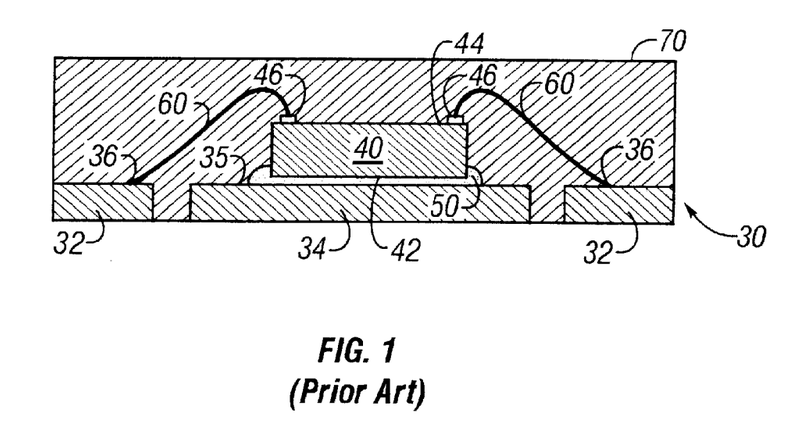
FIG. 1 is a diagrammatic sketch in a sectional view showing a conventional non-leaded package.

FIG. 1 shows a conventional non-leaded molded integrated circuit package, generally at 10. A lead frame 30 is the supporting structure of the molded integrated circuit package 10 to which the other elements are attached. The lead frame 30 is made from a thin metal strip by etching or stamping to form a pattern of leads 32 around a die attach paddle 34. A die 40 is mounted upon an "upper" die support surface 35 of the die paddle 34 using a die attach material 50, which is typically an epoxy resin. The die 40 has a "lower" surface 42 in contact with the die attach material 50 and an opposing "upper" surface 44. Electrical connections between the die circuitry and the leads 32 are provided by fine gold wires 60, which are bonded to die bond pads 46 on the die 40 at the upper die surface 44 and to wire bond surfaces 36 on the leads 32 of the lead frame using a wire bond technique. The lead frame 30, die 40 and wires 60 are covered with a thermoset plastic encapsulation or casing 70 using transfer molding.

Figure 2:
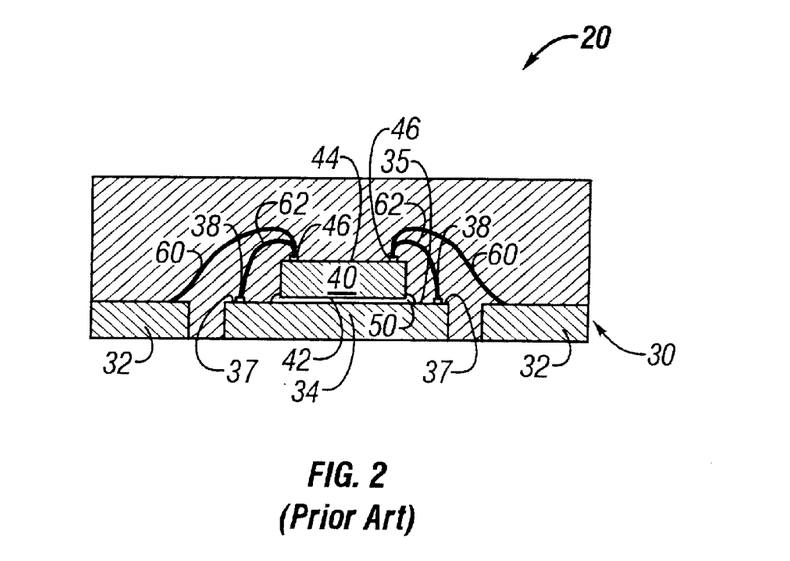
FIG. 2 is a diagrammatic sketch in a sectional view showing a conventional non-leaded package having down bonds.

FIG. 2 shows another conventional non-leaded molded integrated circuit package, generally at 20. In this configuration, as in the package shown in FIG. 1, a lead frame 30 includes a pattern of leads 32 around a die attach paddle 34. A die 40, having lower and upper surfaces 42, 44 is affixed to a die support surface 35 on the die paddle 34 using a die attach material 50. Fine gold wires 60 are bonded to die bond pads 46 at the upper die surface 44 and to wire bond surfaces on the leads 32 by wire bonding. In this configuration, electrical connections between the die circuitry and the die paddle 34 are additionally provided by fine gold wire down bonds 62, which are bonded to die bond pads 46 at the upper die surface 44 and to down bond surfaces 38 near the margin 37 of the die paddle 34. The lead frame 30, die 40 and wires 60 and 62 are covered with a thermoset plastic casing.

The integrated circuit packaging industry is always driving toward more reliable packages, and smaller, thinner and more lightweight packages. The lead frame thickness of conventional non-leaded packages limits reduction of package thickness, and conventional non-leaded packages are less reliable than are other package types. One approach to reducing package thickness is to eliminate a central die attach paddle, as is shown for example in Mostafazadeh et al. U.S. Pat. No. 5,894,108. An approach to improving structural reliability is to add lips on the die pad edge, as is shown for example in Glenn U.S. Pat. No. 6,143,981. Reduction of lead frame thickness results in an undesirable loss of frame stiffness. Reduction of the thickness of the plastic encapsulation can result in reduced package reliability. Formation of lips on the die pad edge can result in sharp edged lips that can act as initiation points for propagation of cracks in the encapsulation or of delamination of the encapsulation from the lead frame, which can disrupt the electrical connection (particularly at the down bond or wire bond attachment sites) and deteriorate package reliability.

To reduce overall package thickness, the thickness of the encapsulation may be reduced; or the die may be made thinner; or a thinner lead frame may be employed. Reduction of package thickness conventionally entails making compromises, either in the manufacturability (and therefore the manufacturing cost) or the reliability of the package. Generally, a thinner die has poorer resistance to die cracking. And thinner lead frames generally are more difficult to handle.

SUMMARY

The invention is directed to lead frame configurations providing for lead frame surface mount packages having improved structural integrity and electrical reliability.

Generally according to the invention, the die supporting surface of the die attach paddle is on a plane at a different level from the down bonds attachment surface, or may be on a plane at the same level, but separated at least partly by a slot (which may be a groove). The die support surface may be recessed below the plane of the down bond attachment surface, or the die support surface may be in a plane with the down bonds attachment surface, but separated at least partially by a slot or recess in the plane. In configurations where the die attach surface is on a plane at a different level, a barrier between the die attach region and the down bonds attach site is provided by an edge of the down bonds attachment surface (if the plane of the die attach surface is lower) or by an edge of the die attach surface (if the plane of the die attach surface is higher). This barrier limits flow of the die attach epoxy outward from the die attach region to the down bonds attach site during the die attachment process. Or, in configurations where a recess or slot is formed on the paddle surface, situated between the die attach region and a down bond attachment site, the recess interrupts the surface at the down bonds attachment site from the surface at the die attach region, and serves as a moat for collection of die attach epoxy that may flow outward from the die attach region during the die attach process.

According to the invention, the integrity and reliability of down bonds is improved by inhibiting epoxy bleed out to the down bonds attachment sites.

Also generally according to the invention, portions of the lead frame, particularly on the paddle near the paddle margin, or on the leads, are sculptured in various configurations to provide improved interlock between the encapsulation and the lead frame. The configurations which may for example include grooves, slots, scallops, and recesses, are designed so as to avoid formation of sharp edges (that is, to avoid formation of acute edges), which may serve as initiation sites for propagation of cracks in the encapsulation or delamination of the encapsulation from the lead frame. These various features according to the invention provide various mechanical functions such as mold locking, prevention of die attach epoxy resin bleed and delamination propagation. Encapsulation material can be injected into the sculptured features during package assembly, and serve to hold the lead frame and package body together and to provide resistance from package cracking and delaminating. Certain of the various sculptured features can additionally serve as a dam or moat to prevent overflow of die attach into the down bonds attachment sites during the die attach process.

Configurations having a recessed die attach region provide for a thinner overall package without substantially compromising the mechanical properties or handling qualities of the lead frame. Moreover, by thinning the die paddle without entirely eliminating it at the die attach region, the die paddle may be soldered directly to an underlying circuit board, to provide for efficient heat dissipation from the die.

Because the invention provides for improved reliability of electrical connections to the lead frame, the invention also provides for reliable manufacture of thinner and more reliable packages at lower cost. The configuration of the slots or depressions in the paddle and lead surfaces provide for a thinner overall package profile without compromise of structural integrity or of reliability of electrical connections.

Any of the various lead frames of the invention can be made by a conventional manufacturing process, usually a chemical process such as etching, using conventional materials and process machinery. Other processes, for example a mechanical process (such as drilling or stamping), that may be employed may be less efficacious than etching.

The invention features a lead frame for a surface mount semiconductor chip package, including a die attach paddle and leads. The die attach paddle has a peripheral margin having down bond attachment sites on an upper surface of the paddle near the margin, and having a central die attach region on an upper surface of the paddle. In one general aspect of the invention, a portion of the upper surface of the paddle is recessed to provide a site for accumulation of any die attach material that may during a die attach process flow from the die attach region toward any of the down bond attachment sites.

In some embodiments the recessed portion of the upper surface of the paddle includes the die attach region. In some embodiments the recessed portion of the upper surface of the paddle includes a groove or slot situated at least in part between at least one of the down bond attachment sites and the die attach region; in some such embodiments the recessed portion includes a groove arranged substantially parallel to the peripheral margin of the paddle; in other such embodiments the recessed portion includes a groove at least partly surrounding at least one of the down bond attachment sites. In some embodiments the recessed portion of the upper surface of the paddle includes a plurality of recesses extending from near the peripheral margin of the die attach paddle inward toward the die attach region; in some such embodiments the recesses extending from near the margin alternate with nonrecessed portions of the surface, each having one or more down bond attachment sites; in some such embodiments the non recessed portions of the surface extending outwardly beyond a base margin of the paddle to form cantilever portions, and in some such embodiments the down bond attachment sites are on the cantilever portions. In some embodiments in which the recessed portion includes a groove, a depth of the groove is at least approximately half a thickness of the paddle; in some such embodiments, the groove is a slot passing through the entire thickness of the paddle.

In another general aspect, the invention features a non-leaded molded package having a second die stacked over a first die attached on a die attach region of a surface of a lead frame. In some embodiments a spacer, such as a silicon spacer, is interposed between the first die and the second die in the stack.

BRIEF DESCRIPTION OF THE DRAWINGS

The invention will now be described in further detail by reference to the drawings, which illustrate alternative embodiments of the invention. The drawings are diagrammatic, showing features of the invention and their relation to other features and structures, and are not made to scale. Particularly, certain thickness dimensions are exaggerated in the Figures. for purposes of illustration. For improved clarity of presentation, in the Figures. illustrating embodiments of the invention, elements corresponding to elements shown in other drawings are not all particularly renumbered, although they are all readily identifiable in all the Figures. For easy reference, similar or analogous features identified in the various embodiments shown in the drawings are identified by similar numbers; thus, for example, a feature identified by reference numeral 340 in FIG. 3A is similar to or analogous to the feature identified by reference numeral 440 in FIG. 4A, for example, and is similar or analogous to the feature identified by reference numeral 840 in FIG. 8; and so on. Also for improved clarity of presentation, many and various conventional details of the illustrations, not necessary to an understanding of the invention, are omitted from the drawings.

DETAILED DESCRIPTION

Referring now to the Figures, FIG. 1 and FIG. 2 are diagrammatic sketches in a sectional view showing two types of conventional non-leaded package, as described above in Background.

Figure 3A:
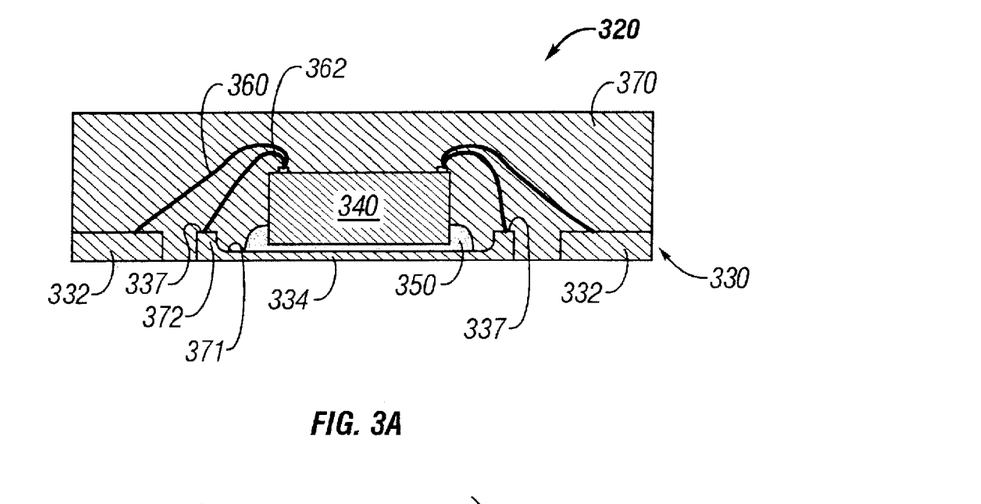
FIG. 3A is a diagrammatic sketch in a sectional view showing a package according an embodiment of the invention, in which the die is mounted on a recessed portion of the lead frame, and down bonds are attached at down bond attachment sites on a nonrecessed portion of the paddle on the lead frame.

FIG. 3A is a diagrammatic sketch showing a package 320 according to an embodiment of the invention, in which the die 340 is mounted using a die attach material 350 such as an epoxy on a recessed die attach region 370 in the lead frame 330 die paddle 334, and in which down bonds 362 are attached at down bond attachment sites 337 on a nonrecessed peripheral portion 372 of the die paddle 334. Wire bonds 360 are additionally shown leading to leads 332, and enclosed by plastic encapsulation 370. The nonrecessed portion 372 of the die paddle provides a barrier for outward creep of the die attach epoxy onto the down bond attachment sites 337 during the die attachment process.

Figure 3B:
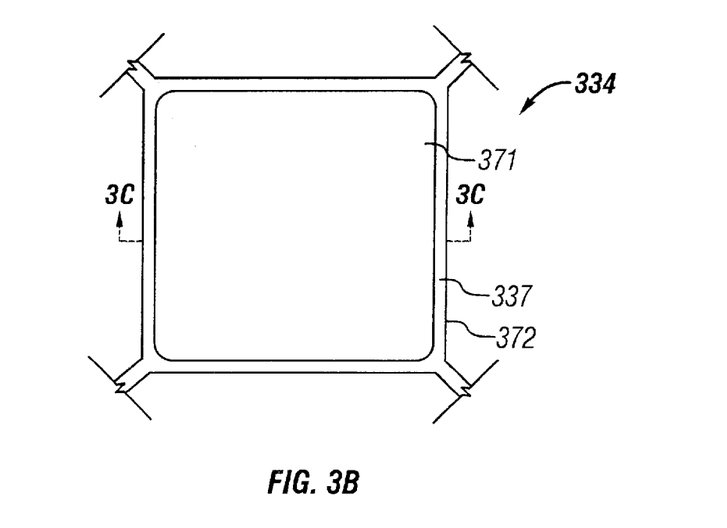
FIG. 3B is a diagrammatic sketch in a plan view showing a die paddle according to an embodiment of the invention as in FIG. 3A.
Figure 3C:
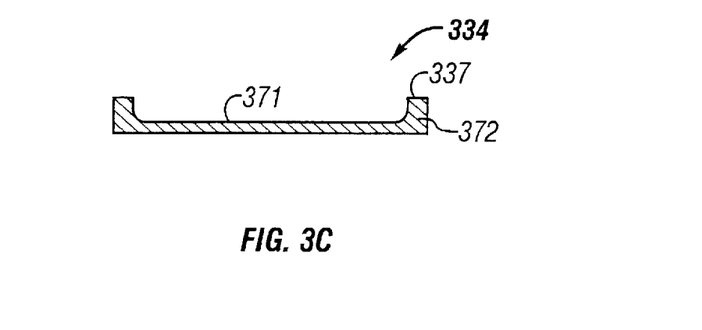
FIG. 3C is a diagrammatic sketch in a sectional view thru a die paddle at C—C in FIG. 3B.

FIG. 3B is a diagrammatic sketch in a plan view showing a die paddle 334 as in FIG. 3A, prior to attachment of the die; and FIG. 3C is a diagrammatic sketch in a sectional view at C—C in FIG. 3B thru a die paddle 334 as in FIG. 3A. The recess 371 in the die paddle 334 can be formed by any of a variety of techniques, including particularly a chemical etch. The recess 371 is made sufficiently deep that the nonrecessed portions 372 can provide a barrier to flow of the die attachment material up onto the surface on the nonrecessed portions 372 where the down bond attachment sites are located 337. In addition to providing a barrier for epoxy bleed out, the recess entails a thinning of the die paddle beneath the die, and thereby contributes to extent to which the overall package thickness can be reduced using a die of a given thickness.

Figure 4A:
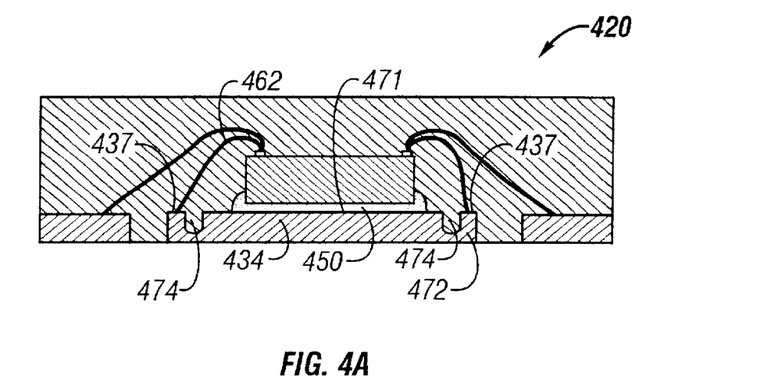
FIG. 4A is a diagrammatic sketch in a sectional view showing a package according to another embodiment of the invention, having a groove between the die attach region and the down bonds attachment sites.

FIG. 4A is a diagrammatic sketch in a sectional view showing a package 420 according to another embodiment of the invention, in which a slot or groove 474 is formed near the periphery 472 of the die paddle 434 between the die attach region 471 and the attachment sites 437 for the down bonds 462. The die attach region of the die paddle in this embodiment is not recessed; here the groove 474 serves as a moat to collect any die attach epoxy 450 that may bleed away from the die attach region during the die attach process, and thereby to prevent the die attach epoxy from contaminating down bond attachment sites 437 on the peripheral surface of the margin 472 of the die paddle. In this respect, at least, the groove 474, situated between the down bond attachment sites and the die attach region isolates the down bond attachment sites from the die attach region.

Figure 4B:
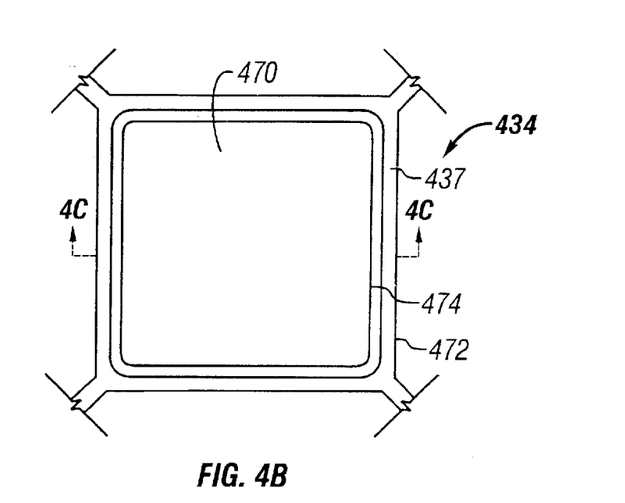
FIG. 4B is a diagrammatic sketch in a plan view showing a die paddle according to an embodiment of the invention as in FIG. 4A.
Figure 4C:
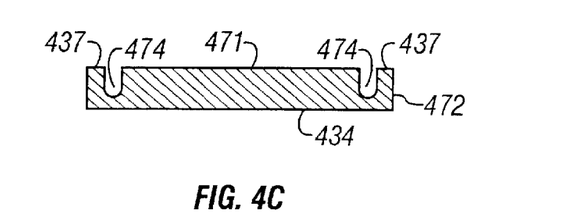
FIG. 4C is a diagrammatic sketch in a sectional view thru a die paddle at C—C in FIG. 4B.

FIG. 4B is a diagrammatic sketch in a plan view showing a die paddle 434 as in FIG. 4A, prior to attachment of the die; and FIG. 4C is a diagrammatic sketch in a sectional view at C—C in FIG. 4B thru a die paddle 434 as in FIG. 4A. Groove 474 near the die paddle periphery 472 can be formed by any of a variety of techniques, including particularly a chemical etch. The groove 474 can be formed using any of variety of techniques; a chemical etch process may be particularly useful. The groove 474 is shown by way of example in FIG. 4C as having a generally U-shaped cross section, which can be readily formed by chemical etch; however, any of a variety of other cross sectional shapes (triangular, rectangular, for example) can be entirely acceptable according to the invention, although some shapes may be more difficult to form than others. No particular dimensions are required for groove 474; the groove need only be sufficiently wide and define a sufficient volume so that it can effectively collect and contain any creeping die attach material that might otherwise reach and contaminate the down bond attachment regions 437. In some configurations, by way of example, the grooves may have a width in the range about 0.15 to 0.25 mm and a depth about half the thickness of the lead frame. The groove 474 may, in fact, take the form of a slot passing entirely through the die paddle, as described for example with reference to FIG. 10 below. However, because a very deep groove or a slot passing entirely through the die paddle can contribute to comprising the mechanical integrity of the die paddle, it may be preferable in some embodiments, depending upon the kinds and degrees of stresses that are likely to be imposed upon the package, to limit the dimensions of the groove to approximately a minimum that would be required to contain any escaping die epoxy.

Figure 5A:
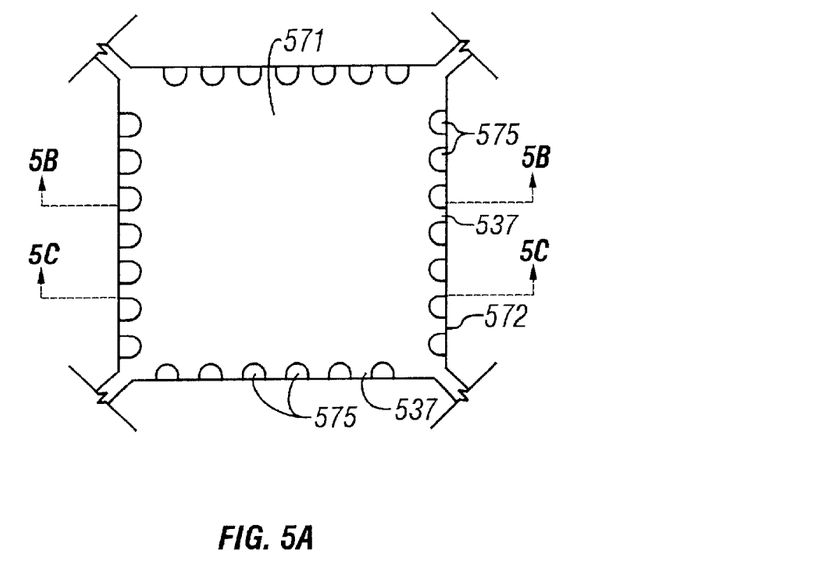
FIG. 5A is a diagrammatic sketch in a plan view showing a die paddle according to another embodiment of the invention, having grooves formed in and generally perpendicularly to the upper die paddle edge to reduce stresses and to provide interlock of the die paddle and the encapsulation material.

FIG. 5A is a diagrammatic sketch in a plan view showing a die paddle 534 prior to die attachment according to another embodiment of the invention; and 5B and 5C are sectional views thru the paddle 534 as indicated at, respectively, B—B and C—C in FIG. 5A. The die paddle 534 has marginal recesses 575 formed at intervals in and generally perpendicularly to the die paddle margin 572 to reduce stresses and to provide interlock of the die paddle and the encapsulation material. In some configurations the recesses 575 are arranged to alternate with nonrecessed surface portions, which may serve as down bond sites, for example 537. The marginal recesses are filled with encapsulation material during the encapsulation process, so that the recesses and nonrecessed portions provide for a robust interlock of the die paddle and the encapsulation. This can reduce cracking and delamination near the down bond attachment sites, and can thereby improve the integrity of the package. Additionally, while the recesses may be formed with other shapes than that shown in FIGS. 5A and 5B, whatever the shape the edges of the recesses are preferably not acute, to reduce the likelihood that cracking or delamination may be initiated at the edges.

Figure 5B:
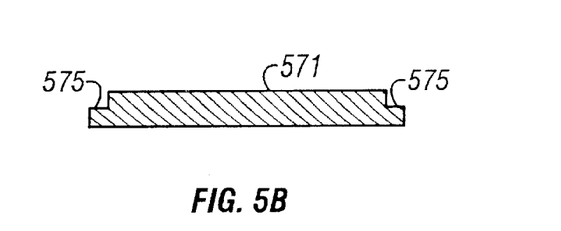
FIG. 5B is a diagrammatic sketch in a sectional view thru a die paddle at B—B in FIG. 5A.
Figure 5C:
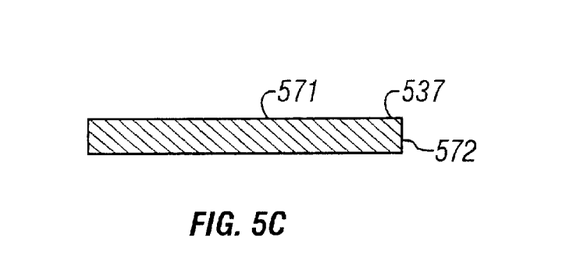
FIG. 5C is a diagrammatic sketch in a sectional view thru a die paddle at C—C in FIG. 5A.
Figure 5D:
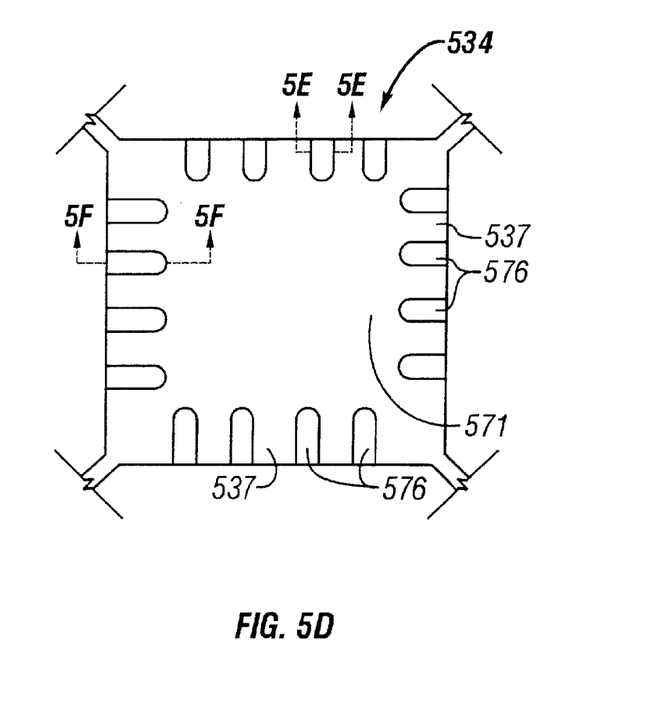
FIG. 5D is a diagrammatic sketch in a plan view showing a die paddle according to another embodiment of the invention, having grooves as in FIGS. 5A–5C extending inwardly to near the periphery of the die attach region.
Figure 5E:
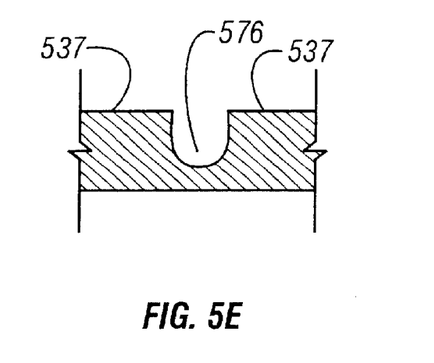
FIG. 5E is a diagrammatic sketch in a sectional view thru a die paddle at E—E in FIG. 5D.
Figure 5F:
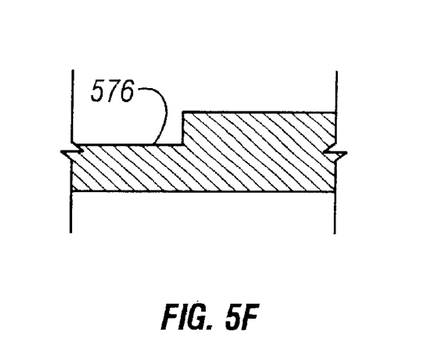
FIG. 5F is a diagrammatic sketch in a sectional view thru a die paddle at F—F in FIG. 5D.

In the configuration of FIGS. 5A, 5B and 5C, the recesses are not situated between the die attach region 571 and the down bond sites 537, and so they do not work as an isolating moat as do, for example, the grooves in the embodiments of FIGS. 4A–4C. Nevertheless, they can provide traps for creeping die attach material, helping to prevent contamination of the down bond attachment sites during the die attach process. This trapping function can be made more effective by forming the marginal recesses (576) so that they extend further inward toward the die attach region 571, as illustrated for example in FIGS. 5D, 5E and 5F. The inwardmost extent of the recessed portions 576 can be formed very close to the edge of the die attach region, to more effectively trap creeping die attach material. Thus although, as in the configuration of FIGS. 5A, 5B and 5C, the recesses in this configuration are not situated between the die attach region and the down bond attach sites, and so they cannot isolate the down bond attach sites, they can effectively protect the sites 537 from contamination by creeping die attach material, because the sites 537 are located on the marginal ends of nonrecessed surface peninsulas between the recesses.

Figure 6A:
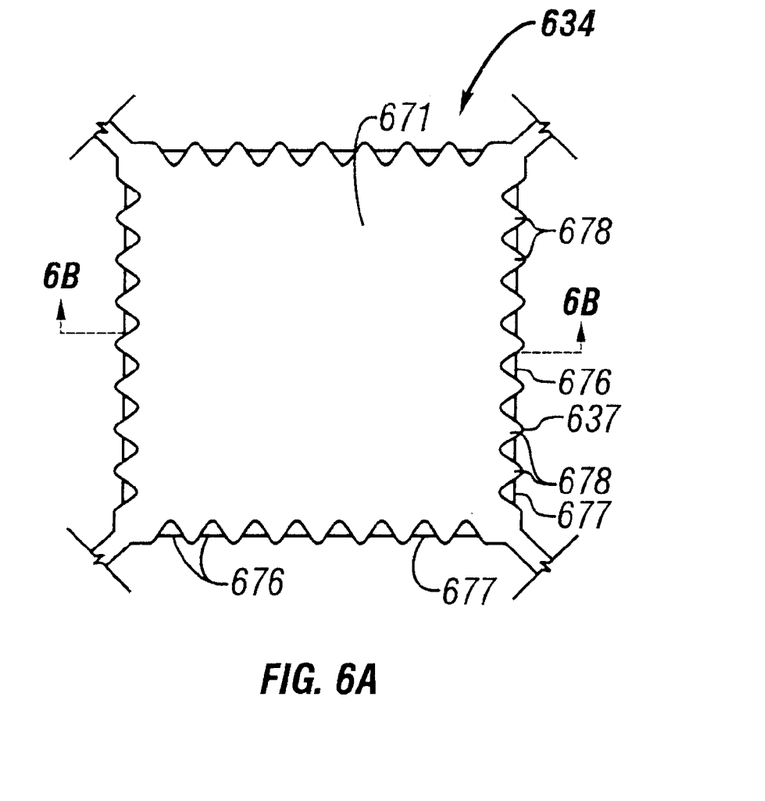
FIG. 6A is a diagrammatic sketch in a plan view showing a die paddle according to another embodiment of the invention, having the die paddle scalloped to reduce stresses and to provide better reliability performance of the package.
Figure 6B:
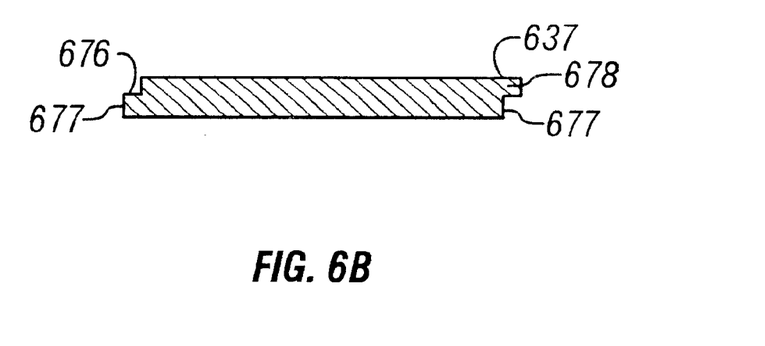
FIG. 6B is a diagrammatic sketch in a sectional view thru a die paddle at B—B in FIG. 6A.

Protection of the down bond attachment sites by locating the sites away from the die attach region on the marginal ends of peninsulas between marginal recesses can alternatively (or additionally) be provided by a configuration as shown in FIGS. 6A and 6B. FIG. 6A is a diagrammatic sketch in a plan view showing a die paddle 634 according to another embodiment of the invention, and FIG. 6B is a diagrammatic sketch in a sectional view thru a die paddle at B—B in FIG. 6A. Here marginal recesses, for example 677, are formed alternating with peninsulas in the surface of the die paddle near the margin, and the down bond attachment sites 637 are located on cantilevers 678 that extend beyond the bulk margin 677 of the paddle 634.

Figure 7A:
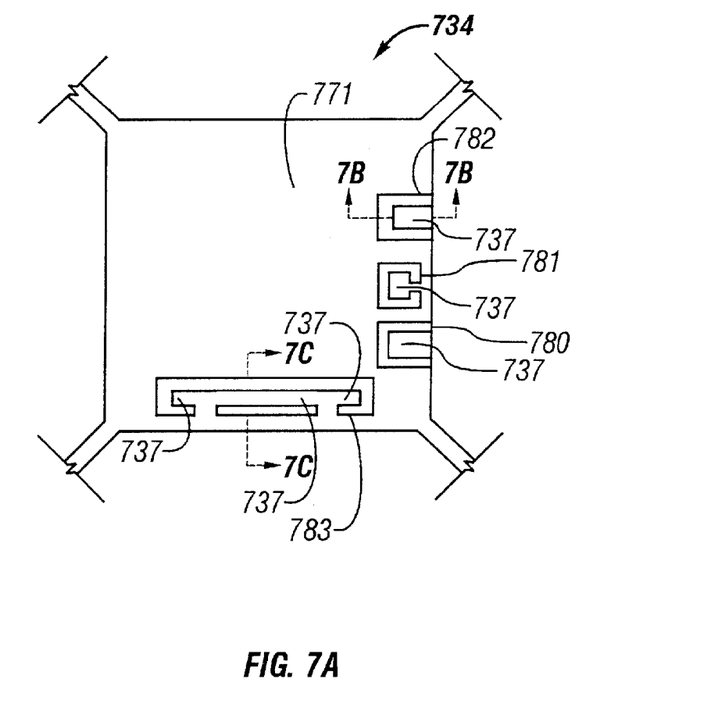
FIG. 7A is a diagrammatic composite sketch in a plan view showing a die paddle having alternative configurations for isolation grooves near down bond sites according to further embodiments of the invention.
Figure 7B:
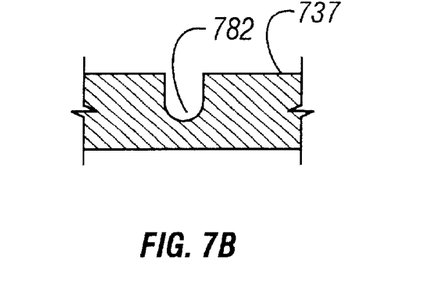
FIG. 7B is a diagrammatic sketch in a sectional view thru a die paddle at B—B in FIG. 7A.
Figure 7C:
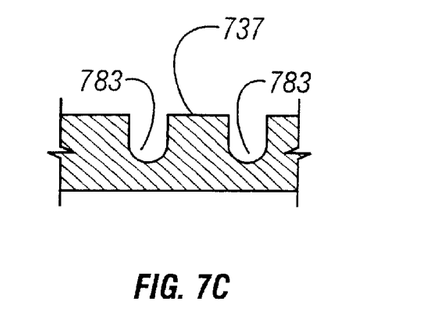
FIG. 7C is a diagrammatic sketch in a sectional view thru a die paddle at C—C in FIG. 7A.

FIG. 7A is a diagrammatic composite sketch in a plan view showing a die paddle 734 prior to die attachment, having examples of various alternative configurations for grooves 780, 781, 782, 783 each serving to effectively isolate down bond sites 737 according to the invention, as described generally above. FIGS. 7B and 7C are sketches in sectional view thru portions of the die paddle at B—B and at C—C, respectively, in FIG. 7A. Here, as discussed with reference to FIGS. 4A, 4B, the groove may have any of a variety of cross-sectional shapes, and may have dimensions selected to effectively collect any creeping die attach material that may approach the down bond attachment sites during the die attachment process.

Figure 8:
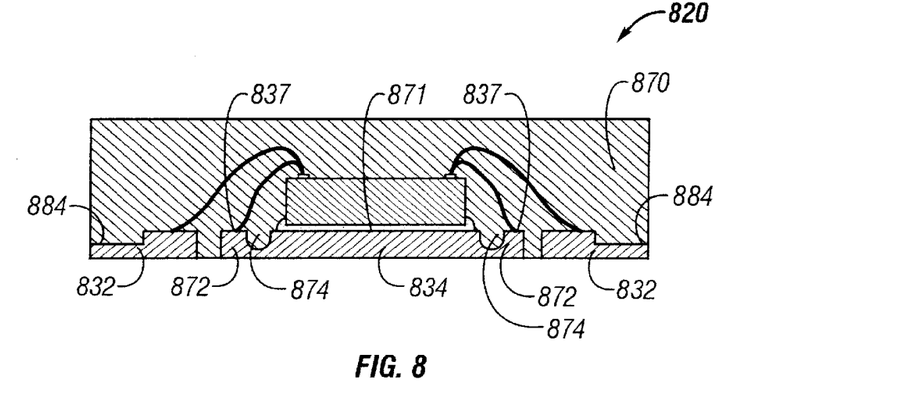
FIG. 8 is a diagrammatic sketch in a sectional view thru a package according to another embodiment of the invention, having a groove running generally parallel to the edge of the die paddle between the die attachment region and the down bonds attachment sites generally as in FIG. 4A, and additionally having recesses in the upper surface of the leads.
Figure 9:
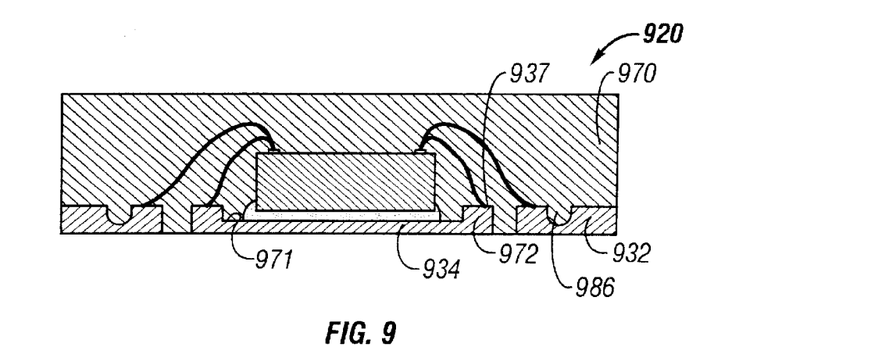
FIG. 9 is a diagrammatic sketch in a sectional view thru a package according to another embodiment of the invention, having a recessed die attach region on the paddle generally as in FIG. 3A, and additionally having a groove in the upper surface of the lead portion of the lead frame.
Figure 10:
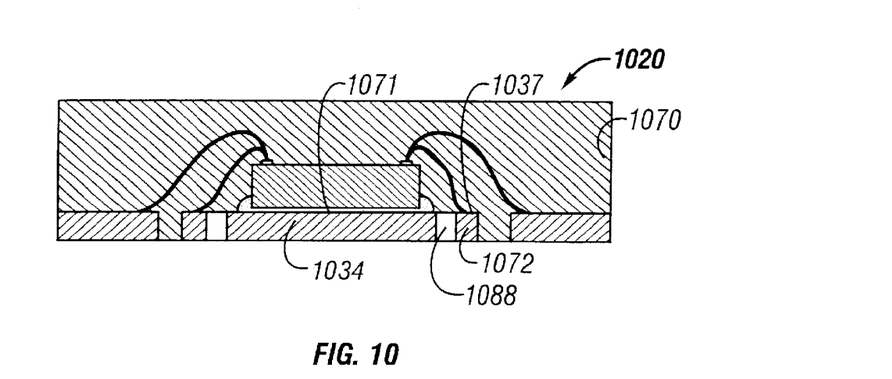
FIG. 10 is a diagrammatic sketch in a sectional view thru a package according to another embodiment of the invention having a slot through the die paddle running generally parallel to the die paddle edge, between the die attachment region and the down bonds attachment sites.

FIGS. 8–10 illustrate various further embodiments of assembled packages according to the invention, in which various sculptural features are provided on the lead frame (on the die paddle or the leads or on both leads and paddle) to trap die attach materials and thereby prevent contamination of down bond attachment sites; or to provide improved interlock between lead frame elements and the encapsulation material and thereby improve package integrity; or both for protection and improvement of package integrity.

FIG. 8 is a diagrammatic sketch in a sectional view thru a package 820 according to another embodiment of the invention, having a groove 874 running generally parallel to the margin 872 of the die paddle 834, between the die attachment region 871 and the down bond attachment sites 837, and additionally having recesses 884 in the upper surface of the leads 832. The groove 874 in this embodiment serves to isolate the down bond sites 837 from the die attach region 871 and additionally to provide improved interlock between the die paddle and the encapsulation 870.

FIG. 9 is a diagrammatic sketch in a sectional view thru a package 920 according to another embodiment of the invention, having a recessed die attach region 971 on the paddle 934 generally as in FIG. 3A, and additionally having a groove 986 in the upper surface of the lead portion 932 of the lead frame. The groove 986 in this embodiment serves to provide improved interlock between the leads and the encapsulation 970.

FIG. 10 is a diagrammatic sketch in a sectional view thru a package 1020 according to another embodiment of the invention having a slot 1088 through the die paddle 1034 running generally parallel to the die paddle edge 1072, between the die attachment region 1071 and the down bonds attachment sites 1037. The slot serves both as a moat for trapping die attach epoxy during the die attach process, and to provide improved interlock between the die paddle 1034 and the encapsulation 1070.

Figure 11:
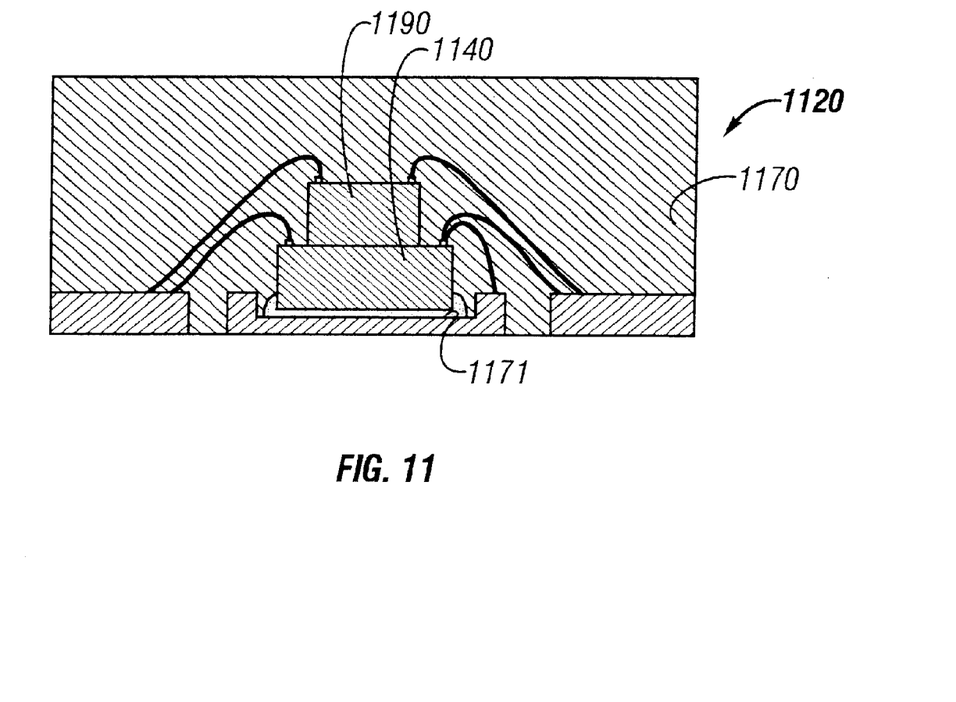
FIG. 11 is a diagrammatic sketch in a sectional view thru a stacked die package according to an embodiment of the invention.

FIG. 11 is a diagrammatic sketch in a sectional view thru a stacked die package 1120 according to an embodiment of the invention. In this configuration a first die 1140 is attached in a recessed die attach region 1171, generally as shown and described for die 340 in FIG. 3A, and a second die 1190 is stacked upon the first die 1140. Both of the dies and their respective wire bonds to the leads and down bonds to the paddle margin are enclosed in encapsulation 1170.

Figure 12:
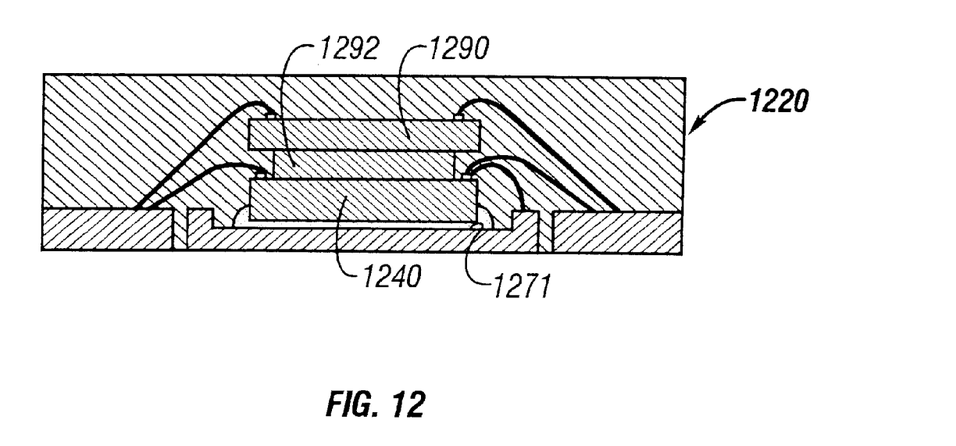
FIG. 12 is a diagrammatic sketch in a sectional view thru a stacked die package according to another embodiment of the invention.

FIG. 12 is a diagrammatic sketch in a sectional view thru a stacked die package 1220 according to another embodiment of the invention. A first die 1240 is mounted generally as shown and described for die 340 in FIG. 3A, and a second die 1290 is placed upon a silicon spacer 1292 imposed between the first die and the second die.

As will be appreciated, a stacked die arrangement may be constructed by stacking a second die on a first die attached to a die attachment surface on any of the various die paddle configurations according to the invention, or on a conventional paddle.

Other embodiments are within the following claims.

What is claimed is:

1. A lead frame for a surface mount semiconductor chip package, comprising a die attach paddle and leads, the die attach paddle having a lower surface, the die attach paddle lower surface being entirely generally planar, the die attach paddle having down bond attachment sites on an upper surface of the paddle near a peripheral margin of the paddle, and having a generally planar recessed central die attach region on an upper surface of the paddle.

2. The lead frame of claim 1, further comprising a plurality of recesses in the upper surface of the die paddle and extending from near the peripheral margin of the die attach paddle inward toward the die attach region.

3. The lead frame of claim 2 wherein the recesses extending from near the margin alternate with nourecessed portions of the surface, each said nonrecessed portion having one or more down bond attachment sites on an upper surface thereof.

4. The lead frame of claim 3 wherein the nonrecessed pardons of the surface extend outwardly beyond a base margin of the paddle to form cantilever portions.

5. The lead frame of claim 4 wherein the down bond attachment sites are on the cantilever portions.

6. A lead frame surface mount package comprising the lead frame of claim 1.

7. A nonleaded molded package having a second die stacked over a first die attached on the die attach region of the lead frame of claim 1.

8. The stacked die package of claim 7 having a spacer interposed between the first die and the second die.

9. A lead frame for a surface mount semiconductor chip package, comprising a die attach paddle and leads, the die attach paddle having a lower surface, the entire lower surface being generally planar, the die attach paddle having down bond attachment sites on an upper surface of the paddle near a peripheral margin of the paddle, and having a central die attach region on an upper surface of the paddle, the lead frame further comprising a plurality of recesses in the upper surface of the die paddle and extending from near the peripheral margin of the die attach paddle inward toward the die attach region, the recesses extending from near the margin alternating with nonrecessed portions of the surface, each said nonrecessed portion having one or more down bond attachment sites on an upper surface thereof, said nonrecessed portions of the surface extending outwardly beyond a base margin of the paddle to form cantilever portions.

10. The lead frame of claim 9 wherein the down bond attachment sites are on the cantilever portions.

\* \* \* \* \*